(12) United States Patent
Holm Jensen (10) Patent No.: US 10,499,519 B2
(45) Date of Patent: Dec. 3, 2019

(54) CONCEALABLE APPARATUS ASSEMBLY

(71) Applicant: Albiral Display Solutions, S.L., Sant Hipòlit de Voltregà (ES)

(72) Inventor: Henrik Bo Aage Holm Jensen, Sant Hipòlit de Voltregà (ES)

(73) Assignee: Albiral Display Solutions, S.L., Sant Hipòlit de Voltregà (ES)

( * ) Notice: Subject to any disclaimer, the term of this patent is extended or adjusted under 35 U.S.C. 154(b) by 0 days.

(21) Appl. No.: 16/074,933

(22) PCT Filed: Feb. 2, 2017

(86) PCT No.: PCT/EP2017/052192
§ 371 (c)(1),
(2) Date: Aug. 2, 2018

(87) PCT Pub. No.: WO2017/134129
PCT Pub. Date: Aug. 10, 2017

(65) Prior Publication Data
US 2019/0045645 A1 Feb. 7, 2019

(30) Foreign Application Priority Data
Feb. 5, 2016 (EP) .................... 16382048

(51) Int. Cl.
*H05K 5/02* (2006.01)
*A47B 21/06* (2006.01)
(Continued)

(52) U.S. Cl.
CPC ........... *H05K 5/0217* (2013.01); *A47B 21/04* (2013.01); *A47B 21/06* (2013.01); *H01R 13/74* (2013.01);
(Continued)

(58) Field of Classification Search
CPC ........ H05F 5/0239; H05F 5/0217; H05F 5/03; F16H 19/001; A47B 21/04;
(Continued)

(56) References Cited

U.S. PATENT DOCUMENTS 7,621,764 B2 * 11/2009 Shunjie .................. H01R 13/44
174/480
8,233,283 B2 * 7/2012 Mazzullo ............... H01R 35/04
361/715

(Continued)

FOREIGN PATENT DOCUMENTS

EP 1182747 B1 3/2005

OTHER PUBLICATIONS

Bianchi, Damiano, "International Search Report," prepared for PCT/EP2017/052192, dated May 4, 2017, three pages.

*Primary Examiner* — Daniel J Rohrhoff
(74) *Attorney, Agent, or Firm* — Winstead PC (57) ABSTRACT

The present invention relates to a concealable apparatus assembly, comprising a support structure (5) supporting an apparatus (M) and rotatably receivable in an opening (1*a*) of a board or of a plate (1) so that the apparatus (M) is accessible through said opening (1*a*) from a first major surface of the board or plate (1) at a first angular position adopted by said support structure (5), and concealed for other angular positions adopted thereby, the support structure (5) having or supporting a flat surface (2) which remains flush with said first major surface of the board or plate (1) at a second angular position adopted by said support structure (5). The support structure (5) is also linearly receivable in said opening (1*a*) so that it can move linearly according to an approaching/distancing direction with respect to the board or plate (1).

15 Claims, 4 Drawing Sheets

(51) Int. Cl.
  *H01R 13/74* (2006.01)
  *A47B 21/04* (2006.01)
  *H05K 5/00* (2006.01)
  *H01R 35/00* (2006.01)
  *F16H 19/00* (2006.01)
  *H04R 1/04* (2006.01)
  *H05K 5/03* (2006.01)

(52) U.S. Cl.
  CPC ......... *H05K 5/0008* (2013.01); *H05K 5/0247* (2013.01); *A47B 2021/066* (2013.01); *A47B 2021/068* (2013.01); *A47B 2200/0073* (2013.01); *A47B 2200/0082* (2013.01); *F16H 19/001* (2013.01); *H01R 35/00* (2013.01); *H04R 1/04* (2013.01); *H05K 5/0017* (2013.01); *H05K 5/03* (2013.01)

(58) Field of Classification Search
  CPC ........ A47B 2021/066; A47B 2021/068; A47B 2200/0082
  See application file for complete search history.

(56) References Cited

U.S. PATENT DOCUMENTS

| | | | | |
|---|---|---|---|---|
| 8,690,590 | B2 * | 4/2014 | Byrne | H05K 5/03 439/131 |
| 2003/0070592 | A1 * | 4/2003 | Grasse | A47B 21/06 108/50.02 |
| 2004/0147147 | A1 * | 7/2004 | Griepentrog | H01R 13/447 439/131 |
| 2015/0009652 | A1 * | 1/2015 | Alexander | H01R 35/04 362/95 |
| 2015/0320203 | A1 * | 11/2015 | Mandon | A47B 21/06 108/20 |
| 2015/0380854 | A1 * | 12/2015 | Oosterman | H01R 13/44 439/131 |

* cited by examiner

CONCEALABLE APPARATUS ASSEMBLY

The present invention generally relates to a concealable apparatus assembly, capable of providing a concealing and a revealing position for an apparatus with respect to the opening of a board or plate, and more specifically to an assembly providing improved concealing, revealing and intermediate positions.

BACKGROUND OF THE INVENTION

Concealable apparatus assemblies, which comprise a support structure supporting an apparatus and rotatably receivable in an opening of a board or of a plate so that the apparatus is accessible through said opening from a first major surface of the board or plate at a first angular position adopted by said support structure, and concealed for other angular positions adopted thereby, the support structure having or supporting a flat surface which remains flush with said first major surface of the board or plate at a second angular position adopted by said support structure, are known in the state art.

EP1182747B1 discloses one of said known assemblies, where the apparatus is at least one mains and/or data socket, particularly for computers and the telephone, and the support structure is a housing rotatably received in a recess of a tabletop. The housing has a circular cross-sectional shape with two or more flat surfaces offset from one another, and the apparatus is flush with one of the flat surfaces.

EP1182747B1 discloses the features defined in the preamble clause of claim 1 of the present invention.

The assembly discloses by EP1182747B1 has some shortcomings, which are caused by the room needed by the housing during the rotation thereof. One of said shortcomings is that said rotation makes the housing project above the tabletop recess, as shown in FIG. 4 of said patent, during the intermediate rotation positions. Another shortcoming is that for the desired housing stop positions, i.e. those when one of the flat surface is parallel to the tabletop, a surrounding gap between the tabletop contour and the housing flat surface outer contour is left, which causes the need of the mounting of a frame plate over the tabletop, modified to have a rounded recess in the lower face thereof complementary to the outer rounded profile of the housing, as shown in FIGS. 3 and 4 of EP118274761. Even with such a modified frame plate a small gap between the contour of the through opening of the frame plate and the housing flat surface outer contour exists, and, moreover, the flat surface of the modified frame plate does not remain at the same plane as the one occupied by the upper face of the tabletop, but slightly above it It is, therefore, necessary to provide an alternative to the state of the art which covers the gaps found therein, by the provision of an assembly which overcomes the above mentioned shortcomings, and hence provides a perfect fitting between the flat surfaces thereof and the opening through which the assembly is received, and does not either project above said opening during intermediate rotation positions.

DESCRIPTION OF THE INVENTION

To that end, the present invention relates to a concealable apparatus assembly, which comprises, in a known manner, a support structure supporting an apparatus and rotatably receivable in an opening of a board (such as a table top) or of a plate (such as a frame plate mounted on a table top) so that the apparatus is accessible through said opening from a first major surface of the board or plate at a first angular position adopted by said support structure, and concealed for other angular positions adopted thereby, the support structure having or supporting a flat surface (generally constituting a cover) which remains flush with said first major surface of the board or plate at a second angular position adopted by said support structure.

In contrast to the known concealable apparatus assemblies, in the one proposed by the present invention, in a characteristic manner, the support structure is also linearly receivable in the opening of the board or plate so that it can move linearly according to an approaching/distancing direction with respect to the board or plate. This linear movement allows to overcome the above mentioned shortcoming of the prior art assemblies.

For some embodiment, the support structure is a housing or enclosure housing there within at least some portion of the apparatus and/or mechanisms associated thereto.

For other embodiments, the support structure does not house the apparatus but only supports the same.

For a preferred embodiment, the assembly of the present invention is embeddable in a desk or other kind of table, whether over or under an opening defined in a board of the desk, preferably the one constituting the desk table top.

For other embodiments, the assembly of the present invention is embeddable in a board or surface of other kind of furniture or structural member, such as a wall.

For other embodiments, the assembly of the present invention is surface mountable, in a desk, wall, or any kind of board.

For some embodiments, the assembly comprises the above mentioned plate, such as a frame plate, or is fixed thereto, and hence, at the second angular position and at the most approached linear distance, the flat surface of the support structure perfectly fits the through opening of the plate, without the surrounding gap existing in the prior art proposals (i.e. perfectly covering the plate opening) and/or the needing of a lower rounded recess made in the plate.

For other embodiments, the assembly does not comprises any plate, neither is fixed to a plate, and hence, at the second angular position, the flat surface of the support structure perfectly fits the opening of the board, without the surrounding gap existing in the prior art proposals (i.e. perfectly covering the board opening). In this case, the support structure is fixed to the board by any appropriate means, such as by fixation brackets.

By providing a lining or coating over the flat surface of the support structure equal to the one provided on the major face of the board and/or of the plate, the assembly is visually integrated with the board/plate when fit in the opening of the board and/or of the plate.

Moreover, the above mentioned undesired projection of the support structure during intermediate rotation positions is avoided by selecting an appropriate most distance position for the linear movement, i.e. a depth distance under the board or plate which allows to perform the rotation of the support structure invisibly from the outside of the board.

Depending on the embodiment, the above mentioned apparatus is one or more of the next apparatuses: a microphone, a display and one or more electrical and/or data sockets, or any other kind of electrical or electronic apparatuses or pieces of equipment.

For a preferred embodiment, the support structure is linearly receivable in the opening of the board or plate so that it moves orthogonally with respect to the board or plate when linearly moving according to said approaching/distancing direction.

For other alternative embodiments, the support structure is linearly receivable in the opening of the board or plate so that it moves transversally but not orthogonally with respect to the board or plate when linearly moving according to said approaching/distancing direction, but tilted a predetermined angle with respect to the board or plate.

According to an embodiment, the assembly of the present invention comprises guiding means for guiding the support structure in both, the rotation movement and the linear movement with respect to the board or plate.

Said guiding means comprise at least one guide member fixed to the board or plate and including one or more guides, and the support structure includes one or more cooperating guide elements engaged to said one or more guides.

Said guide member includes, according to an embodiment, a first and a second guide, and the support structure includes a first and a second cooperating guide element respectively engaged to said first and second guide.

For an embodiment, said first guide and said first cooperating guide provide only a linear displacement and said second guide and said second cooperating guide provide a linear displacement and a circular displacement.

According to an embodiment, the first and the second guide are respective slots arranged in the same first plane, and the first and the second cooperating guide elements are respective pins projecting from a first end side of the support structure facing said guide member and longitudinally and transversally offset in a second plane parallel to said first plane, wherein said pins are engaged to slide along said first and second slots.

According to a preferred variant of said embodiment:
the first slot is an elongated straight slot which runs orthogonally with respect to the board or plate and has first and second ends, so that when the first pin is at said first end the support structure is at the most approached position with respect to the board or plate, and when the first pin is at said second end the support structure is at the most distance position with respect to the board or plate; and
the second slot has:
two parallel elongated straight slot stretches having substantially the same length as said first elongated straight slot, arranged, in said first plane, in parallel and longitudinally offset with respect to the first slot and equidistantly arranged side by side with respect to the first slot in a transverse direction, each of said straight slot stretches having a first and a second end, arranged so that when the first pin is at said first end of the first elongated straight slot the second pin is at the first end of one of the straight slot stretches; and
a circumferential arc slot stretch interconnecting the second ends of the straight slot stretches at two respective joint points and having a geometrical centre in said first plane at a distance substantially equal to the distance between the first and the second pins in said second plane, so that when the first pin is at the second end of the first elongated straight slot the second pin is at one of said joint points, such that the second pin can travel along the circumferential arc slot stretch while the first pin pivots about its geometrical axis staying at the second end of the first elongated straight slot to make the support structure rotate.

The assembly of the present invention comprises, for an embodiment, driving means connected to the support structure or to an element connected thereto, to automatically move it according to said rotation movement and said linear movement with respect to the board or plate, under the control of electric and/or electronic control means.

For a particular implementation of said embodiment, said driving means comprise a motor kinematically connected to the second pin to move it through all the stretches of the second slot, said second pin movement causing the first pin to move linearly along the first slot and pivotally about its geometrical axis when at said second end thereof, so that the support structure is moved according to said rotation movement and to said linear movement.

Other alternative implementations are also embraced by the present invention, such as kinematically connecting the motor to another region of the support structure other than said second pin.

The assembly of the invention comprises, for an embodiment, part or all of said electric and/or electronic means which are adapted, together with the driving means, departing from a position at which the apparatus is accessible through the opening of the board or plate, performing a concealing function comprising the next sequential movements:
linearly moving the support structure in said distancing direction until the first pin arrives to the second end of the first slot,
rotating the support structure according to a first rotation direction, pivoting about the first pin while the second pin travels along the circumferential arc slot stretch from a first of said joint points, at which the support structure is at said first angular position, up to a second of the joint points, at which the support structure is at said second angular position; and
linearly moving the support structure in said approaching direction until the first pin arrives to the first end of the first slot, at which position said flat surface is flush with the first major surface of the board or plate.

The electric and/or electronic means are also adapted, for an embodiment, together with the driving means, departing from a position at which the flat surface is flush with the first major surface of the board or plate, performing a revealing function comprising the next sequential movements:
linearly moving the support structure in said distancing direction until the first pin arrives to the second end of the first slot,
rotating the support structure according to a second rotation direction opposite to said first rotation direction, pivoting about the first pin while the second pin travels along the circumferential arc slot stretch from said second joint point, at which the support structure is at said second angular position, up to said first joint point, at which the support structure is at said first angular position; and
linearly moving the support structure in said approaching direction until the first pin arrives to the first end of the first slot, at which position the apparatus is accessible through the opening of the board or plate.

According to an embodiment, the above mentioned guide member is a plate, and said driving means are kinematically connected to the second pin through a kinematic chain comprising a gear pivotably connected to a point of said plate longitudinally offset with respect to the second end of the first slot, said gear having a through elongated slot configured, dimensioned and arranged so that a free end of the second pin is inserted therein and is pushed by the contour thereof when the gear rotates forcing the second pin to move along the second slot.

Preferably, the guiding means comprises at least a further guide member fixed to the above mentioned board or plate and including one or more guides, and the support structure has an elongated shape having a first end which includes the above mentioned one or more cooperating guide elements, and a second end side opposite to a first end side including one or more further cooperating guide elements engaged to said further guide.

For an embodiment, the assembly of the present invention comprises a housing into which the support structure is housed, wherein the above mentioned guide members are fixed to respective opposite side walls of the housing.

BRIEF DESCRIPTION OF THE DRAWINGS

The previous and other advantages and features will be more fully understood from the following detailed description of embodiments, with reference to the attached drawings, which must be considered in an illustrative and non-limiting manner, in which.

DESCRIPTION OF A PREFERRED EMBODIMENT

As shown in the appended Figures, the present invention relates to a concealable apparatus assembly, comprising a support structure 5 supporting an apparatus and rotatably receivable in an opening 1a of a plate 1 so that the apparatus, in this case a microphone M (see FIG. 8), is accessible through the opening 1a from a first major surface of the plate 1 at a first angular position adopted by the support structure 5 (position depicted in FIGS. 5 and 8), and concealed for other angular positions adopted thereby (positions depicted by FIGS. 1 to 4).

Figure 1:
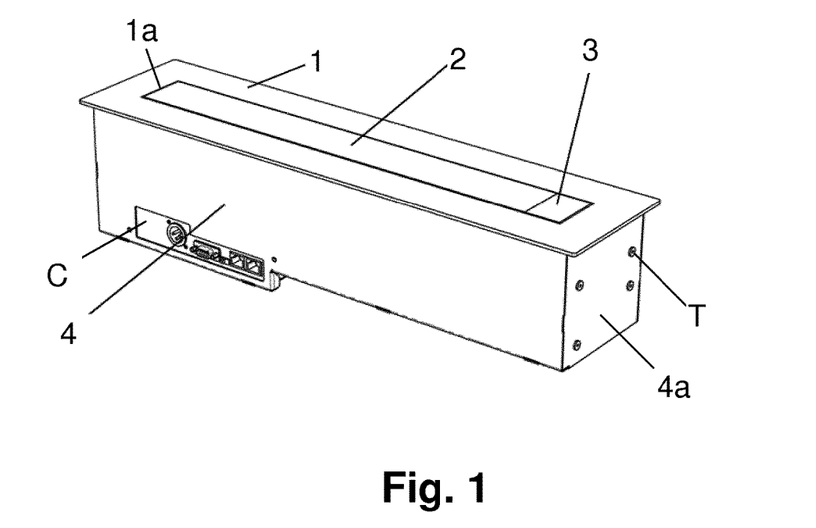
FIG. 1 shows a perspective view of the assembly according to an embodiment of the invention, where the support structure thereof is at a position where the cover mounted thereon perfectly closes the plate opening.
Figure 2:
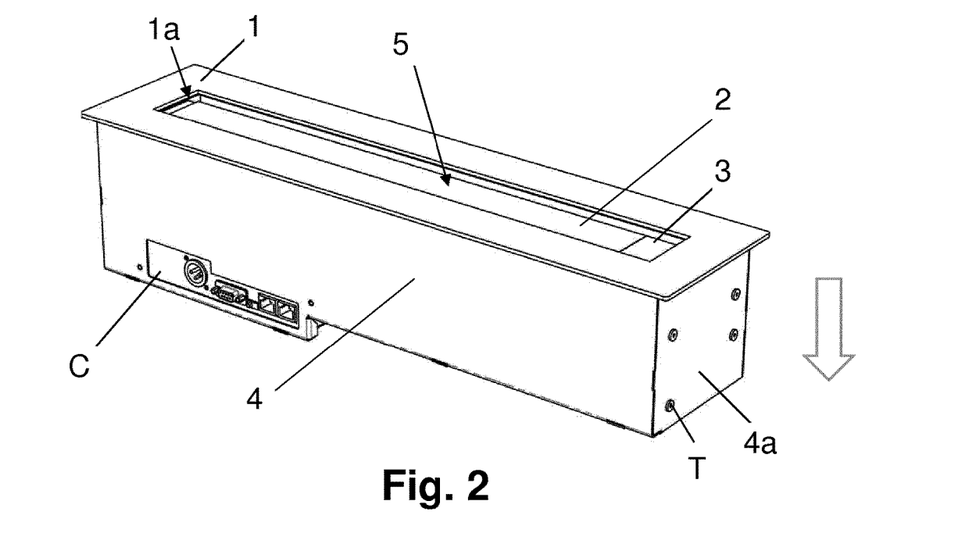
FIG. 2 shows a perspective view of the assembly of the invention for the same embodiment as FIG. 1, but for a position at which the support structure has been linearly moved downwards.

As shown in FIGS. 1 and 2, the support structure 5 has or supports a flat surface 2, constituting a cover 2, a part of which forms a push-button 3, and which remains flush with the first major surface of the plate 1 at a second angular position adopted by the support structure 5, perfectly fit within the opening 1a, avoiding the existence of any surrounding the flat surface, as shown in FIG. 1.

The support structure 5 is also linearly receivable in the opening 1a so that it can move linearly according to an approaching/distancing direction with respect to the plate 1.

For the illustrated embodiment, the support structure is an internal housing or enclosure 5, which houses the microphone M (when at a retracted position) and some mechanisms associated there to.

Generally, the plate 1 is mounted over a table top (not shown), specifically over the contour of a through opening thereof, such that the support structure 5 is rotatably and linearly receivable also in said table top through opening.

Figure 3:
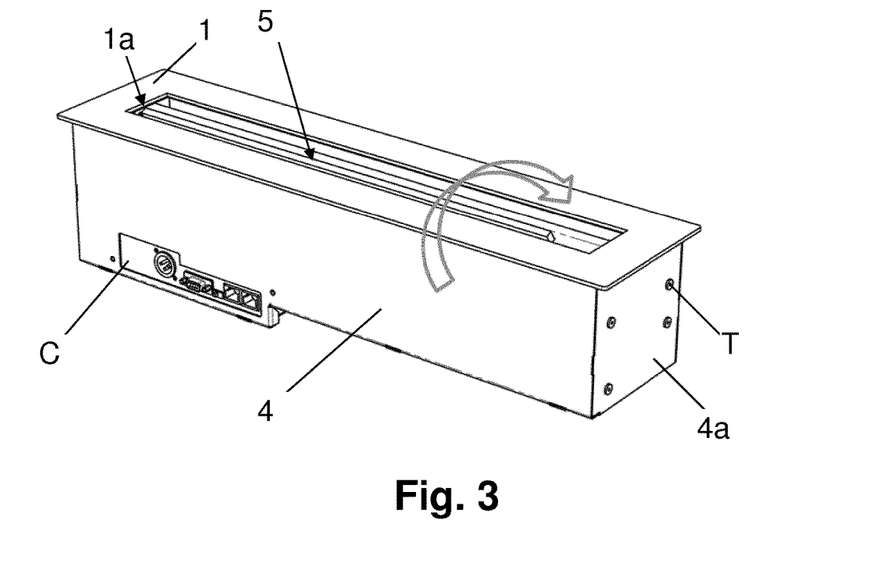
FIG. 3 shows a further perspective view of the assembly of the invention for the same embodiment as FIG. 2, but for a position at which the support structure is rotating while being at the deepest downwards linear position reached by the linear movement depicted in FIG. 2.
Figure 4:
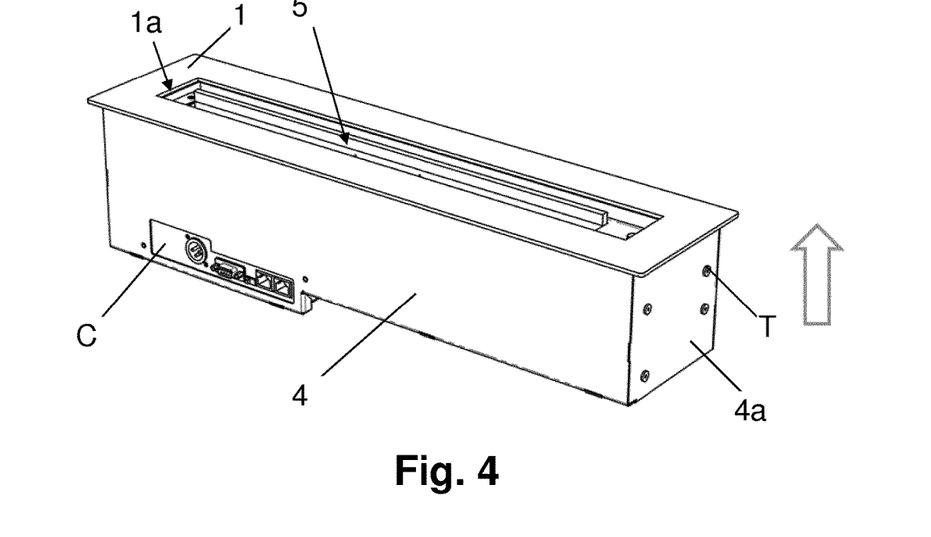
FIG. 4 shows a further perspective view of the assembly of the invention for the same embodiment as FIG. 3, but for a position at which, due to the rotation depicted in FIG. 3, the flat surface supporting the apparatus is already parallel to the plate and the support structure is then linearly moving upwards.
Figure 5:
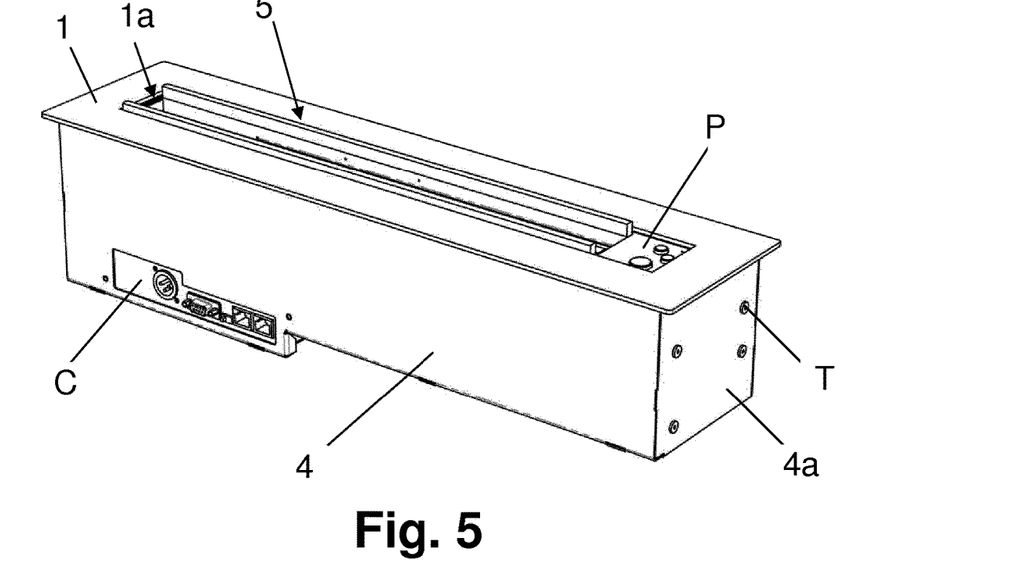
FIG. 5 shows a further perspective view of the assembly of the invention for the same embodiment as FIG. 4, but for a position at which the flat surface supporting the apparatus has already reached the highest linear position, making the apparatus accessible from outside the plate.
Figure 8:
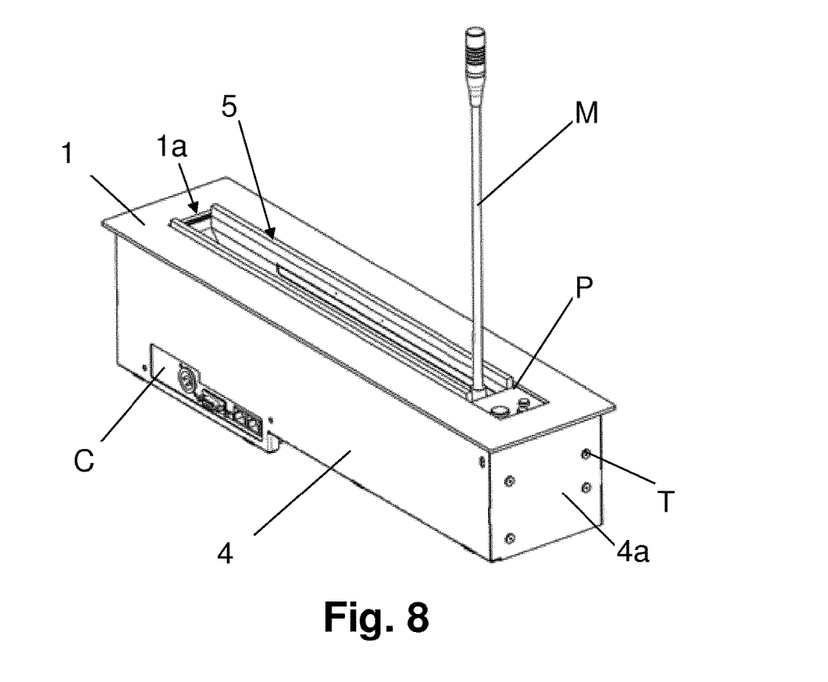
FIG. 8 is a further perspective view of the assembly of the invention, analogous to the one of FIG. 5, but showing the apparatus supported by the support structure, for an embodiment for which said apparatus is a microphone.

FIGS. 1 to 5 show the next sequence of movements of the support structure 5, going from a concealed position to a revealed position: departing from the concealed position illustrated by FIG. 1, the support structure 5 is linearly moved downwards, as indicated by the straight line arrow in FIG. 2, until reaching the most distanced position from the plate 1, then the support structure 5 is clock-wise rotated 90°, as indicated by the curved line arrow in FIG. 3, until reaching the position illustrated in FIG. 4, i.e. until the flat surface supporting the apparatus is parallel to the plate 1, then the support structure 5 is linearly moved upwards, as indicated by the straight line arrow in FIG. 4 until reaching the most approached position with respect to the plate 1, making the apparatus M accessible from the outside, as shown in FIG. 8. An analogous sequence of movements is performed for going from the revealing position to the concealing position, differing from the above described sequence in that the rotation of the support structure 5 is made according to a counter clockwise direction.

Figure 7:
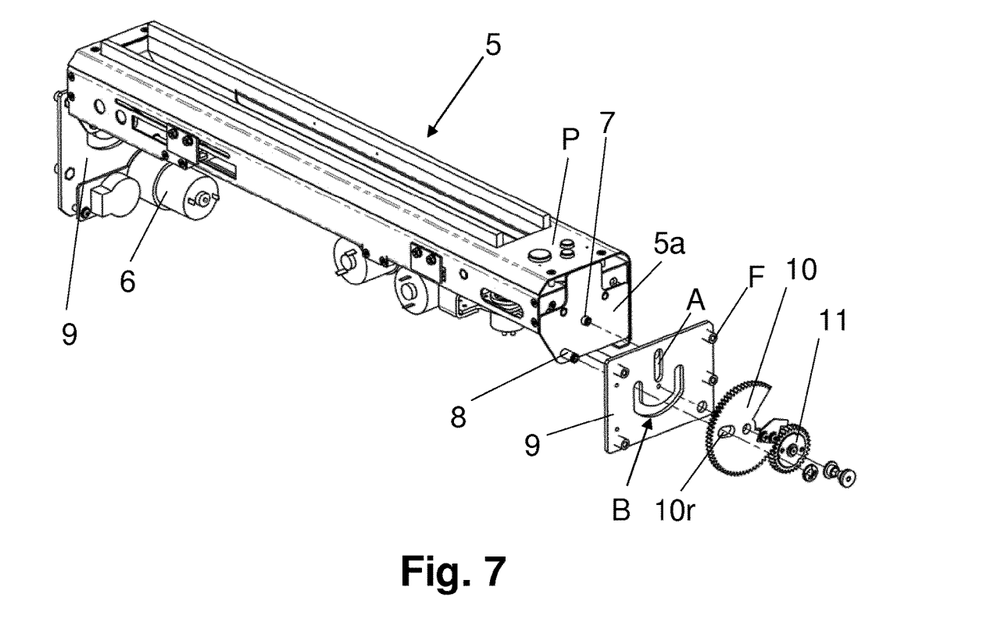
FIG. 7 is an exploded perspective view of the support structure of the assembly of the present invention, two plates as the one of FIG. 6, and driving means for the movements of the support structure, for an embodiment.

FIG. 7 shows the support structure 5 and other mechanisms in charge of performing the above mentioned rotating and linear movements, and will be described below.

Specifically, said rotating and linear movements are provided by the guides defined in plates 9, arranged in front of each end side of support structure 5, and two pairs of pins 7, 8 each projecting from one of the two end sides of support structure 5 (although only one of said end sides is shown, particularly first end side 5a) and introduced into the guides of the corresponding facing guide plate 9 to slide there along.

Figure 6:
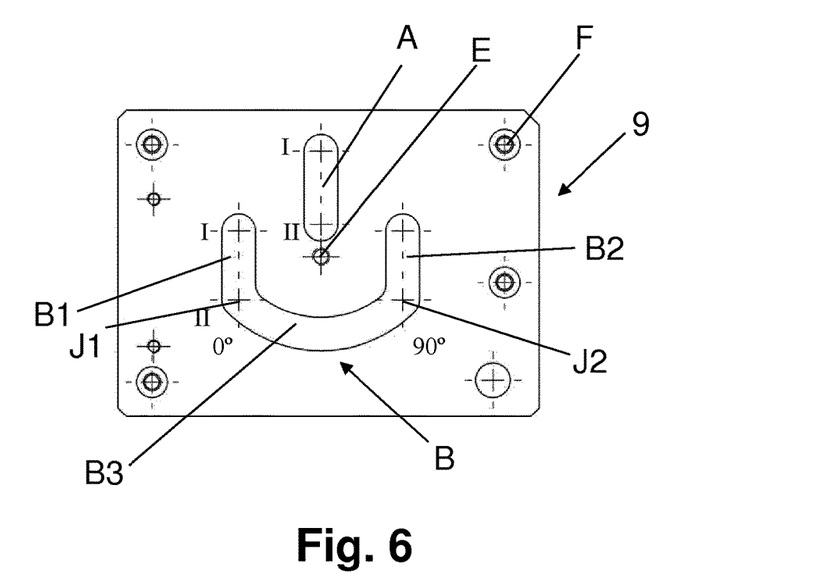
FIG. 6 is a front view of a plate constituting a guide member for the linear and rotating displacements of the support structure of the assembly, for an embodiment.

One of the guide plates 9 is shown in detail in FIG. 6, and comprises first and second guides in the form of respective slots A, B.

As shown in FIG. 7, the pins 7, 8 are longitudinally and transversally offset in a plane parallel to the guide plate 9, and are to be engaged to slide along the first A and the second B slots.

The assembly of the invention comprises a housing 4 (shown in FIGS. 1-5 and 8) into which the support structure 5 is housed, wherein the plates 9 are fixed to respective opposite side walls 4a of the housing 4, in this case by corresponding screws T (see FIGS. 1-5 and 8) introduced and screwed into openings F of guide plate 9 (see FIGS. 6 and 7).

As clearly shown in FIG. 6:
- the first slot A is an elongated straight slot which runs orthogonally with respect to the plate 1 (when the guide plate 9 is mounted orthogonally to the plate 1, as occurs when attached to the housing side wall 4a) and has first (upper) and second (lower) ends, so that when the first pin 7 is at said first end the support structure 5 is at the most approached position with respect to the plate 1, and when the first pin 7 is at said second end the support structure 5 is at the most distance position with respect to the plate 1; and the second slot B has:
two parallel elongated straight slot stretches B1, B2 having substantially the same length as the first elongated straight slot A, arranged in parallel and longitudinally offset with respect to the first slot A and equidistantly arranged side by side with respect to the first slot A in a transverse direction, each of said straight slot stretches B1, B2 having a first (upper) and a second (lower) end, arranged so that when the first pin 7 is at the first end of the first elongated straight slot A the second pin 8 is at the first end of one of the straight slot stretches B1, B2; and a circumferential arc slot stretch B3 interconnecting the second ends of the straight slot stretches B1, B2 at two respective joint points J1, J2 and having a geometrical centre at a distance substantially equal to the distance between the first 7 and the second 8 pins, so that when the first pin 7 is at the second end of the first elongated straight slot A the second pin 8 is at one of said joint points J1, J2, such that the second pin 8 can travel along the circumferential arc slot stretch B3 while the first pin 7 pivots about its geometrical axis staying at the second end of the first elongated straight slot A to make the support structure 5 rotate.

The assembly of the present invention comprises at least part of electric and/or electronic means which are adapted, together with driving means, departing from a position at which the apparatus M is accessible through the opening 1a of the board or plate 1 (position illustrated in FIG. 8), to perform a concealing function (initiated, for example, by pressing push-button 3) comprising the next sequential movements:

linearly moving the support structure 5 in the distancing direction until the first pin 7 arrives to the second (lower) end of the first slot A, and hence the second pin 9 arrives to the second (lower) end of the straight slot stretch B1, i.e. from position I to position II, as indicated in FIG. 6;

rotating the support structure 5 according to a first rotation direction (90° counter clock-wise), pivoting about the first pin 7 while the second pin 8 travels along the circumferential arc slot stretch B3 from a first J1 of the above mention joint points, at which the support structure 5 is at said first angular position, up to a second J2 of the joint points, at which the support structure 5 is at said second angular position; and linearly moving the support structure 5 in said approaching direction until the first pin 7 arrives to the first end of the first slot A, and hence the second pin 9 arrives to the first (upper) end of the straight slot stretch B2, i.e. from position II to position I, as indicated in FIG. 6, at which position the flat surface 2 (including push-button 3) is flush with the first major surface of the plate 1, as shown in FIG. 1.

The electric and/or electronic means are also adapted, together with the driving means, departing from a position at which the flat surface 2 (including push-button 3) is flush with the first major surface of the plate 1 (as shown in FIG. 1), performing a revealing function comprising the next sequential movements:

linearly moving the support structure 5 in said distancing direction until the first pin 7 arrives to the second (lower) end of the first slot A, and hence the second pin 9 arrives to the second (lower) end of the straight slot stretch B2, i.e. from position I to position II, as indicated in FIG. 6;

rotating the support structure 5 according to a second rotation direction (90° clockwise) opposite to the first rotation direction, pivoting about the first pin 7 while the second pin 8 travels along the circumferential arc slot stretch B3 from the second joint point J2, at which the support structure 5 is at the second angular position, up to the first joint point J1, at which the support structure 5 is at the first angular position; and linearly moving the support structure 5 in said approaching direction until the first pin 7 arrives to the first end of the first slot A, and hence the second pin 9 arrives to the first (upper) end of the straight slot stretch B1, i.e. from position II to position I, as indicated in FIG. 6, at which position the apparatus M is accessible through the opening 1a of the board or plate 1.

As shown in FIG. 7, the assembly of the present invention includes driving means comprising an electric motor 6 kinematically connected to the second pin 8 to move it through all the stretches B1, B2, B3 of the second slot B, said second pin 8 movement causing the first pin 7 to move linearly along the first slot A and pivotally about its geometrical axis when at said second end thereof, so that the support structure 5 is moved according to the rotation movement and to the linear movement. Thus, both movements are performed by acting on pin 8, pin 7 acting as a motion follower during the linear displacement of pin 8 along stretch B1 or B2 and as a rotation pivot axis during the circular displacement of second pin 8 along stretch B3.

Specifically, the driving means are kinematically connected to the second pin 8 through a kinematic chain comprising a gear 10 pivotably connected to a point E (see FIG. 6) of one of the plates 9 longitudinally offset with respect to the second end of the first slot A, said gear 10 having a through elongated radial slot 10r configured, dimensioned and arranged so that a free end of the second pin 8 is inserted therein and is pushed by the contour thereof when the gear 10 rotates forcing the second pin 8 to move along the second slot B. The rotation of the gear 10 is caused by a transmission gear 11 actuated by motor 6 through a transmission bar. Although not shown, a further gear 10 is coupled to the pin 8 of the guide plate 9 arranged in front of the other end side of support structure 5. Said guide plate 9 is also supporting motor 6, for the illustrated embodiment.

By means of the above described driving means, both the linear and the rotating movements are provided with only one motor.

For the illustrated embodiment, the assembly of the invention comprise part of the above mentioned electric and/or electronic means, such as a push-button dashboard P, as shown in FIGS. 4, 7 and 8 and preferably includes lighting sources visually indicating (with different colours), for example, the operating status of the apparatus M, or a connection dashboard C (including electric and data sockets), as shown in FIGS. 1-5 and 8.

A person skilled in the art could introduce changes and modifications in the embodiments described without departing from the scope of the invention as it is defined in the attached claims.

The invention claimed is:

1. A concealable apparatus assembly comprising a support structure supporting an apparatus and rotatably receivable in an opening of a board or of a plate so that the apparatus is accessible through said opening from a first major surface of the board or plate at a first angular position adopted by said support structure, and concealed for other angular positions adopted thereby, the support structure having or supporting a flat surface which remains flush with said first major surface of the board or plate at a second angular position adopted by said support structure, wherein the support structure is also linearly receivable in said opening so that it can move linearly according to an approaching/distancing direction with respect to the board or plate, and in that the apparatus comprises a guide mechanism for guiding said support structure in both, a rotation movement and a linear movement with respect to the board or plate.

2. The assembly of claim 1, wherein the support structure is linearly receivable in the opening of the board or plate so that it moves orthogonally with respect to the board or plate when linearly moving according to said approaching/distancing direction.

3. The assembly of claim 1, wherein the support structure is linearly receivable in the opening of the board or plate so that it moves transversally but not orthogonally with respect to the board or plate when linearly moving according to said approaching/distancing direction.

4. The assembly of claim 1, wherein said guide mechanism comprises at least one guide member fixed to said board or plate and including at least one guide, and the support structure includes at least one cooperating guide element engaged to said guide.

5. The assembly of claim 4, wherein said guide member includes a first and a second guide, and the support structure includes a first and a second cooperating guide element respectively engaged to said first and second guide.

6. The assembly of claim 5, wherein said first guide and said first cooperating guide provide only a linear displacement and said second guide and said second cooperating guide provide a linear displacement and a circular displacement.

7. The assembly of claim 6, wherein the first and the second guide are respective slots arranged in the same first plane, and the first and the second cooperating guide elements are respective pins projecting from a first end side of the support structure facing said guide member and longitudinally and transversally offset in a second plane parallel to said first plane, wherein said pins are engaged to slide along said first and second slots.

8. The assembly of claim 7, wherein:
the first slot is an elongated straight slot which runs orthogonally with respect to the board or plate and has first and second ends, so that when the first pin is at said first end the support structure is at the most approached position with respect to the board or plate, and when the first pin is at said second end the support structure is at the most distance position with respect to the board o plate; and
the second slot has:
two parallel elongated straight slot stretches having substantially the same length as said first elongated straight slot, arranged, in said first plane, in parallel and longitudinally offset with respect to the first slot and equidistantly arranged side by side with respect to the first slot in a transverse direction, each of said straight slot stretches having a first and a second end, arranged so that when the first pin is at said first end of the first elongated straight slot the second pin is at the first end of one of the straight slot stretches; and
a circumferential arc slot stretch interconnecting the second ends of the straight slot stretches at two respective joint points and having a geometrical centre in said first plane at a distance substantially equal to the distance between the first and the second pins in said second plane, so that when the first pin is at the second end of the first elongated straight slot the second pin is at one of said joint points, such that the second pin can travel along the circumferential arc slot stretch while the first pin pivots about its geometrical axis staying at the second end of the first elongated straight slot to make the support structure rotate.

9. The assembly of claim 8, comprising a driving mechanism comprising a motor and connected to said support structure or to an element connected thereto, to automatically move it according to said rotation movement and said linear movement with respect to the board or plate, responsive to at least one of electric and electronic control.

10. The assembly of claim 9, wherein said motor is kinematically connected to the second pin to move it through all the stretches of the second slot, said second pin movement causing the first pin to move linearly along the first slot and pivotally about its geometrical axis when at said second end thereof, so that the support structure is moved according to said rotation movement and to said linear movement.

11. The assembly of claim 10, wherein the driving mechanism is adapted, responsive to the at least one of electric and electronic control, departing from a position at which the apparatus is accessible through the opening of the board or plate, to perform a concealing function comprising the next sequential movements:
linearly moving the support structure in said distancing direction until the first pin arrives to the second end of the first slot,
rotating the support structure according to a first rotation direction, pivoting about the first pin while the second pin travels along the circumferential arc slot stretch from a first of said joint points, at which the support structure is at said first angular position, up to a second of the joint points, at which the support structure is at said second angular position; and
linearly moving the support structure in said approaching direction until the first pin arrives to the first end of the first slot, at which position said flat surface is flush with the first major surface of the board or plate;
wherein the driving mechanism is adapted, responsive to at least one of the electric and electronic control, departing from a position at which the flat surface is flush with the first major surface of the board or plate, to perform a revealing function comprising the next sequential movements:
linearly moving the support structure in said distancing direction until the first pin arrives to the second end of the first slot,
rotating the support structure according to a second rotation direction opposite to said first rotation direction, pivoting about the first pin while the second pin travels along the circumferential arc slot stretch from said second joint point, at which the support structure is at said second angular position, up to said first joint point, at which the support structure is at said first angular position; and linearly moving the support structure in said approaching direction until the first pin arrives to the first end of the first slot, at which position the apparatus is accessible through the opening of the board or plate.

12. The assembly of claim 10, wherein said guide member is a guide plate, and said driving mechanism is kinematically connected to the second pin through a kinematic chain comprising a gear pivotably connected to a point of said guide plate longitudinally offset with respect to the second end of the first slot, said gear having a through elongated slot configured, dimensioned and arranged so that a free end of the second pin is inserted therein and is pushed by the contour thereof when the gear rotates forcing the second pin to move along the second slot.

13. The assembly of claim 4, wherein the guide mechanism comprises at least a further guide member fixed to said board or plate and including at least one guide, and the support structure has an elongated shape having a first end which includes said at least one cooperating guide element, and a second end side opposite to a first end side including at least a further cooperating guide element engaged to said further guide.

14. The assembly of claim 13, comprising a housing into which the support structure is housed, wherein said guide members are fixed to respective opposite side walls of said housing.

15. The assembly of claim 1, wherein said apparatus is at least one of the next apparatuses: a microphone, a display and one or more electrical or data sockets.

\* \* \* \* \*